United States Patent
Inoue et al.

[11] Patent Number: 6,133,982
[45] Date of Patent: *Oct. 17, 2000

[54] EXPOSURE APPARATUS

[75] Inventors: Mitsuru Inoue, Utsunomiya; Ryuichi Ebinuma, Tokyo; Kazunori Iwamoto; Hideki Nogawa, both of Utsunomiya, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/968,726

[22] Filed: Nov. 12, 1997

[30] Foreign Application Priority Data

Nov. 15, 1996 [JP] Japan ................................ 8-318616

[51] Int. Cl.⁷ ............................ G03B 27/42; G03B 27/52
[52] U.S. Cl. ............................................. 355/30; 355/53
[58] Field of Search .................................. 355/30, 53, 67, 355/72, 77; 356/400, 401

[56] References Cited

U.S. PATENT DOCUMENTS

| | | | |
|---|---|---|---|
| 4,704,348 | 11/1987 | Koizumi et al. | 430/327 |
| 4,786,947 | 11/1988 | Kosugi et al. | 355/30 |
| 4,801,352 | 1/1989 | Piwczyk | 156/643 |
| 4,998,821 | 3/1991 | Ohta et al. | 353/122 |
| 5,128,975 | 7/1992 | Iwamoto et al. | 378/34 |
| 5,347,561 | 9/1994 | Ebinuma | 378/34 |
| 5,406,351 | 4/1995 | Sardella et al. | 355/53 |
| 5,467,720 | 11/1995 | Korenaga et al. | 108/20 |
| 5,524,131 | 6/1996 | Uzawa et al. | 378/34 |
| 5,654,553 | 8/1997 | Kawakubo et al. | 250/548 |
| 5,691,806 | 11/1997 | Tokuda et al. | 355/72 |
| 5,742,376 | 4/1998 | Makinouchi | 355/53 |
| 5,883,704 | 3/1999 | Nishi et al. | 355/67 |
| 5,907,390 | 5/1999 | Sakamoto | 355/30 |
| 5,917,580 | 6/1999 | Ebinuma et al. | 355/53 |

*Primary Examiner*—Alan A. Mathews
*Assistant Examiner*—Hung Henry Nguyen
*Attorney, Agent, or Firm*—Fitzpatrick, Cella, Harper & Scinto

[57] ABSTRACT

An exposure apparatus having an optical stand for supporting a projecting optical system and a reticle stage, and a base frame have a plurality of struts for supporting the optical stand via dampers. The plurality of struts of the base frame are joined at their upper ends to increase the rigidity of the base frame, thereby reducing vibration caused by acceleration and deceleration of the reticle stage.

21 Claims, 14 Drawing Sheets

EXPOSURE APPARATUS

BACKGROUND OF THE INVENTION

This invention relates to an exposure apparatus and, more particularly, to an exposure apparatus used to manufacture a semiconductor device by exposing a resist on a substrate to a reticle pattern.

Examples of such exposure apparatus known in the art include a stepper which sequentially exposes a plurality of exposure areas on a substrate such as a wafer to a pattern on a reticle via a projecting optical system while the substrate is moved in steps, and a scanning-type exposure apparatus which moves a reticle and a substrate relative to a projecting optical system and scans the reticle and the substrate by slit-shaped exposing light to thereby expose the substrate to the pattern on the reticle by scanning.

A so-called step-and-scan-type exposure apparatus has been proposed in recent years. This apparatus exposes a plurality of areas on a substrate to a fine pattern in a highly accurate fashion by repeating the above-mentioned stepping motion and scanning exposure in such a manner that exposure of a fine pattern can be achieved with greater accuracy. This exposure apparatus is so adapted that the portion of the exposing light comparatively near the optical axis of the projecting optical system is extracted by a slit so that the substrate is exposed by the slit-shaped light. This makes possible the exposure of a fine pattern with improved accuracy.

When scanning exposure is performed in this exposure apparatus, a reticle stage or wafer stage must be moved while controlling position in a precise fashion. To accomplish this, the positions of these stages are monitored by laser interferometers. Further, in order to position a wafer at the focusing position of the projection optical system in this exposure apparatus, the position of the wafer surface is sensed by projecting measurement light onto the wafer using a projector and receiving reflected light from the wafer by a photodetector. Position can thus be sensed highly accurately in accordance with the method of measurement. However, the increasing miniaturization of semiconductor devices in recent years has been accompanied by the appearance of measurement error caused by variations in the temperature of the air along the optical path of measurement. This has led to the adoption of systems in which the temperature along the optical path of measurement is kept fixed by an air conditioner.

In such an exposure apparatus, however, the accuracy with which the positions of the reticle and wafer stages are measured and the accuracy with which the position of the wafer surface is measured are not satisfactory for the purpose of exposing fine patterns with greater precision. In addition, it is required that scanning exposure be started upon attenuation of vibration caused by acceleration and deceleration of the stages when they are moved. The state of the art is such that it takes considerable time for vibration to attenuate. This makes it difficult to improve productivity.

SUMMARY OF THE INVENTION

An object of the present invention is to reduce vibration caused by acceleration and deceleration of the stages, thereby improving throughput.

According to the present invention, the foregoing object is attained by providing an exposure apparatus having a reticle stage, a substrate stage and a projecting optical system which projects a pattern of a reticle onto a substrate, comprising: an optical stand on which the projecting optical system and the reticle stage are mount ed; and a base frame having a plurality of struts and a joining member for joining the plurality of struts at upper portions thereof, the base frame supporting the optical stand via dampers on respective ones of the struts.

In an embodiment of the present invention, the struts of the base frame are three in number, and the joining member has: a triangular member having a generally triangular shape which encircles a triangle defined by the dampers on the three struts; and a strut joining member for joining each of the struts and the triangular member on the exterior side of the triangle defined by the dampers.

The optical stand is supported on the dampers in such a manner that a bottom portion of the optical stand is fitted into the triangular member.

In an embodiment of the present invention, the base frame has a passageway located therebelow for exhausting a gas supplied from a temperature regulating device.

Another object of the present invention is to raise the accuracy of the stage position measurement, thereby facilitating the further miniaturization of semiconductor devices.

According to the present invention, the foregoing object is attained by providing an exposure apparatus having a reticle stage, a substrate stage and a projecting optical system which projects a pattern of a reticle onto a substrate, comprising: an optical stand on which the projecting optical system and the reticle stage are mounted; and a base frame, which has a plurality of struts, for supporting the optical stand via dampers on the struts; the base frame having a passageway located therebelow for exhausting a gas supplied from a temperature regulating device.

According to another aspect of the present invention, the foregoing object is attained by providing an exposure apparatus having a reticle stage, a substrate stage, first measuring means for measuring position of the reticle stage using light, second measuring means for measuring position of the substrate stage using light, and a projecting optical system for projecting a pattern of a reticle onto a substrate, the substrate being exposed to the pattern of the reticle while the substrate stage and the reticle stage are moved based upon results of measuring the positions of both tables, comprising: temperature regulating means for supplying a temperature-controlled gas to optical paths of measurement of the first and second measuring means; and exhausting means for exhausting the gas, which has been supplied from the temperature regulating means, from below the apparatus.

According to an embodiment, the exhausting means has a passageway, which is for exhausting the gas that has been supplied from the temperature regulating means, below a base frame which supports the reticle stage and the projecting optical system.

According to an embodiment, the reticle stage and the substrate stage continue to be moved even when the apparatus is standing by waiting for exposure to be performed. According to another aspect of the present invention, the foregoing object is attained a by providing an exposure apparatus having a reticle stage, a substrate stage, first measuring means for measuring a position of the reticle stage using light, second measuring means for measuring a position of the substrate stage using light, and a projecting optical system for projecting a pattern of a reticle onto a substrate, the substrate being exposed to the pattern of the reticle while the substrate stage and the reticle stage are moved based upon results of measuring the positions of both tables, comprising: temperature regulating means for supplying a temperature-controlled gas to optical paths of measurement of the first and second measuring means, wherein the reticle stage and the substrate stage continue to be moved even when the apparatus is standing by waiting for exposure to be performed.

According to another aspect of the present invention, the foregoing object is attained by providing an exposure apparatus having a projecting optical system for projecting a pattern of a reticle onto a substrate, detecting means for detecting a focusing position of the projecting optical system using light, positioning means for positioning the substrate at the focusing position of the projecting optical system based upon results of detection performed by the detecting means, and temperature regulating means for supplying a temperature-controlled gas to an optical path of measurement of the detecting means; the detecting means having projecting means for projecting light upon the substrate, and photodetecting means for receiving reflected light from the substrate, a distal end portion of the projecting means and a distal end portion of the photodetecting means having such a shape that will not impede flow of gas supplied from the temperature regulating means.

According to an embodiment, the distal end portion of the projecting means and the distal end portion of the photodetecting means are each constituted by a surface that is substantially parallel to the flow of gas supplied from the temperature regulating means.

According to an embodiment, the distal end portion of the projecting means and the distal end portion of the photodetecting means are each constituted by a smooth curved surface.

According to an embodiment, the distal end portion of the projecting means and the distal end portion of the photodetecting means are each constituted by a cylindrical lens or a convex lens.

According to an embodiment, in order to suppress hindrance to the flow of the gas from the temperature regulating means by the projecting means and the photodetecting means, the distal end portion of the projecting means and the distal end portion of the photodetecting means each has a member, a portion of which mainly in contact with the gas flow, is constituted by a curved surface, whereby the projecting means and the photodetecting means exhibit a mushroom shape.

According to an embodiment, a direction in which the gas supplied from the temperature regulating means flows is substantially perpendicular to an optical path of measurement between the projecting means and the photodetecting means.

According to an embodiment, the temperature regulating means has blowing means for blowing the gas, and guide means for guiding the gas, which has been blown from the blowing means, to the optical path of measurement performed by the detecting means, below the projecting optical system.

According to another aspect of the present invention, the foregoing object is attained by providing an exposure apparatus having a reticle stage, a substrate stage, a projecting optical system which projects a pattern of a reticle onto a substrate, detecting means for detecting a focusing position of the projecting optical system using light, and positioning means for positioning the substrate at the focusing position of the projecting optical system based upon results of detection performed by the detecting means, comprising: an optical stand on which the projecting optical system and the reticle stage are mounted; a base frame, which has a plurality of struts, for supporting the optical stand via dampers on the struts; and temperature regulating means for supplying a temperature-regulated gas to an optical path of measurement of the detecting means, wherein the temperature regulating means has a gas blowing portion arranged between any two struts of the base frame so as to blow the gas toward the optical path of measurement of the detecting means.

Further objects, features and advantages of the present invention will become apparent from the following detailed description of the embodiments of the present invention with reference to the accompanying drawings.

DESCRIPTION OF THE PREFERRED EMBODIMENTS

Preferred embodiments of the present invention will now be described with reference to the accompanying drawings.

Figure 1:
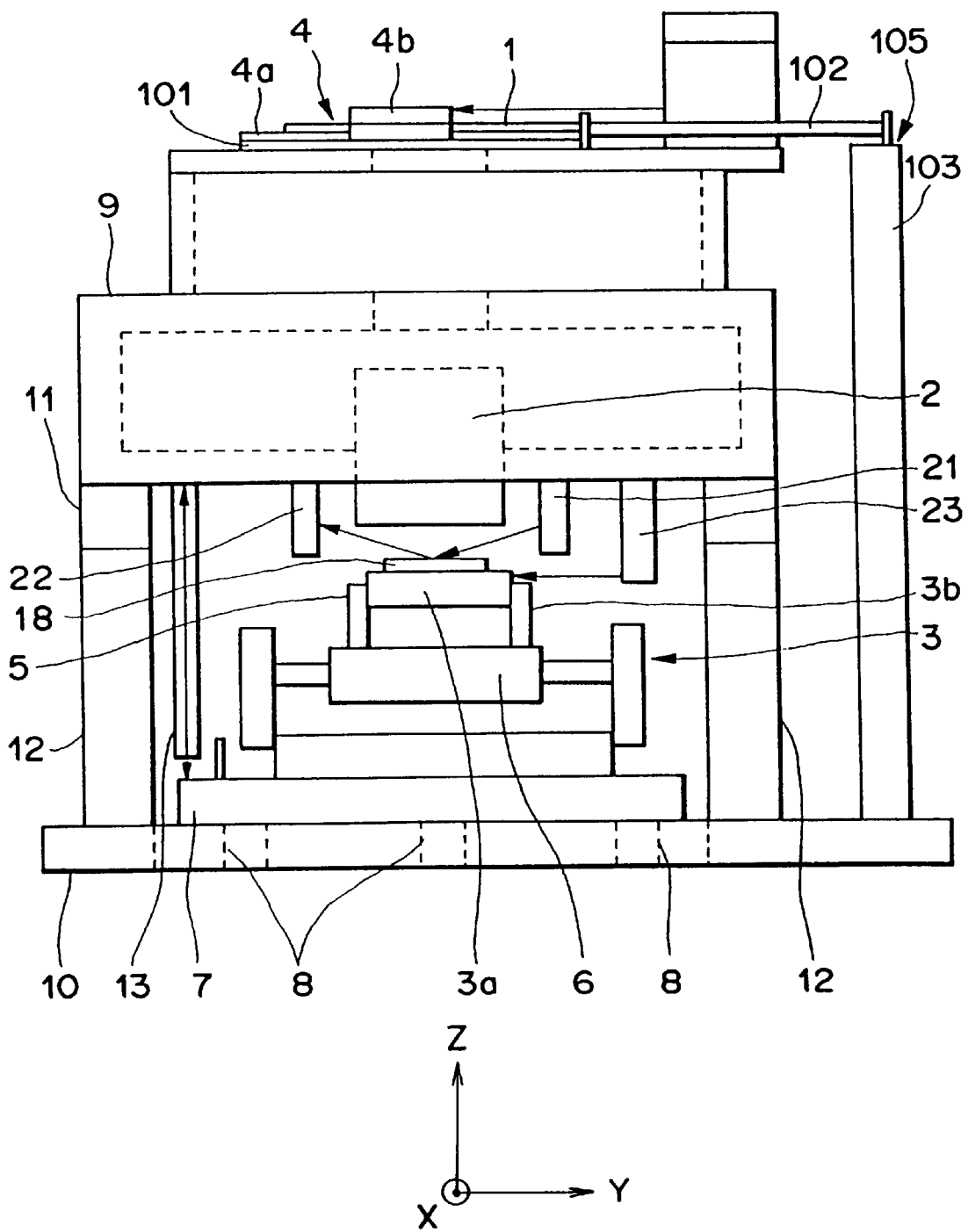
FIG. 1 is a view illustrating a side view of an exposure apparatus according to a first embodiment of the present invention.
Figure 2:
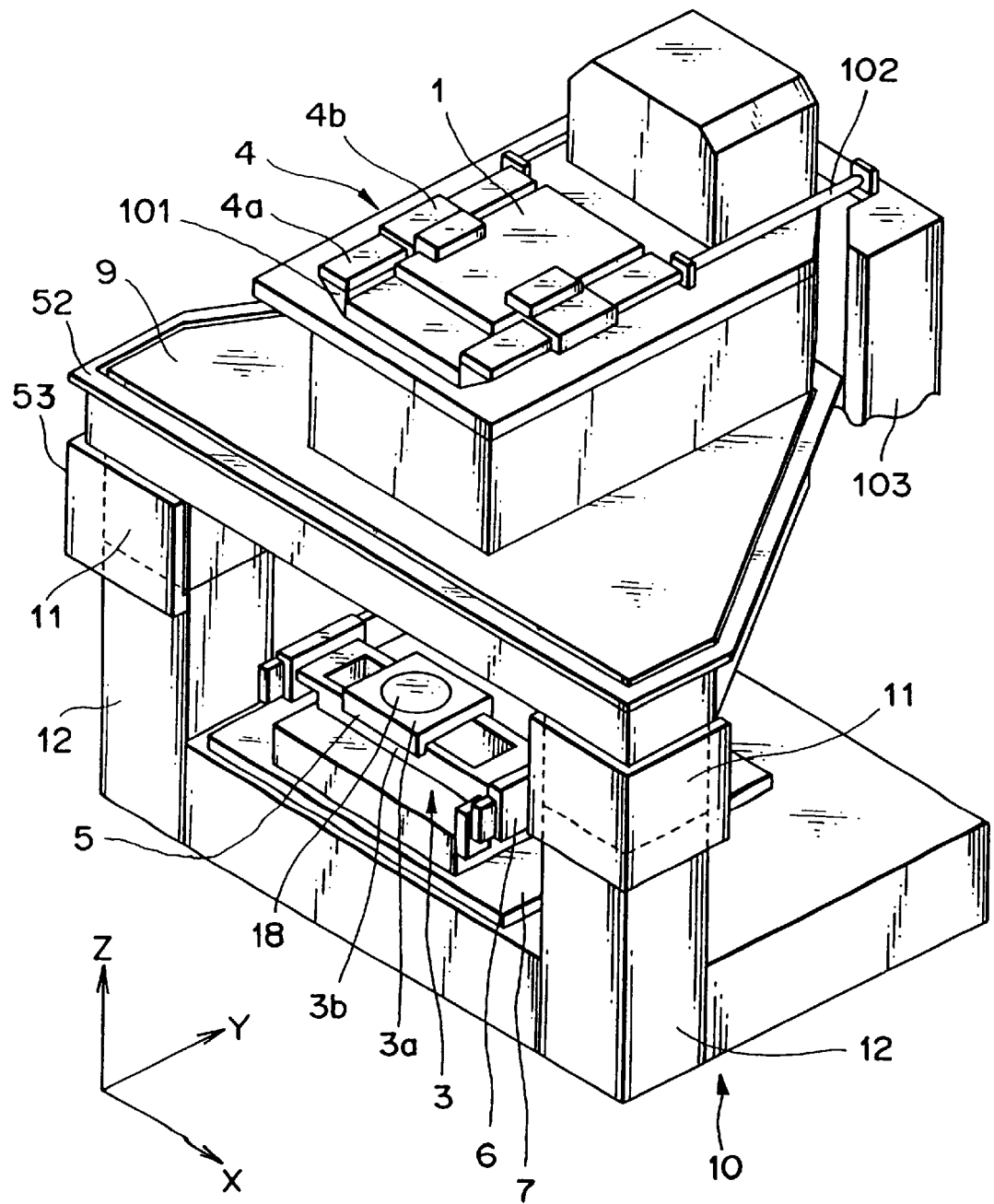
FIG. 2 is a perspective view illustrating the external appearance of the exposure apparatus shown in FIG. 1.

FIG. 1 is a schematic view useful in describing the exposure operation of an exposure apparatus according to a first embodiment of the present invention, and FIG. 2 is a perspective view showing the external appearance of the exposure apparatus. The exposure apparatus shown in these drawings is so adapted that part of the pattern of a reticle on a reticle stage 1 is projected onto a wafer on a fine-adjustment stage 18 provided on an X-Y stage 3 via a projecting optical system 2, and the reticle and wafer are scanned synchronously in the Y direction with respect to the projecting optical system 2 to thereby expose the wafer to the pattern of the reticle. The exposure apparatus, which is a so-called step-and-scan exposure apparatus, performs scanning exposure of a plurality of areas on the wafer repeatedly while interposing a stepping motion.

Movement of the reticle in the scanning (Y) direction is performed by a stage apparatus on the reticle side. The stage has a linear motor 4 which moves a movable element 4b in the scanning direction by applying thrust between a stator 4a and the movable element 4b. A reticle stage 1 is joined to the movable element 4b. The stator 4a is supported by a first supporting portion 101 with a degree of freedom in the Y direction. Further, the stator 4a is supported by a second supporting portion 105 rigidly in the Y direction and flexibly in other directions. The second supporting portion 105 has a column 103 extending upwardly from a base frame 10, and an axial supporting portion 102 extending in the Y direction from the column 103 for supporting the stator 4a rigidly in the Y direction and flexibly in other directions.

The reticle stage 1 is driven in the Y direction by the linear motor 4. The X-Y stage 3 has an X stage 3a driven in the X direction by a linear motor 5 and a Y stage 3b driven in the Y direction by a linear motor 6. Synchronous scanning of the reticle and wafer is carried out by driving the reticle stage 1 and Y stage 3b in the Y direction at a fixed velocity ratio (e.g., 4:1). Stepping in the X direction is performed by the X stage 3a.

The X-Y stage 3 is provided on a stage table 7, which is supported on a platform or the like at three points via three stage dampers 8. The first supporting member 101 and the optical system 2 are provided on a projection lens base plate (an optical stand 9), which is supported on the base frame 10 via three dampers 11 and three struts 12.

A member 53 is secured to the upper part of each strut 12, and the members 53 are joined by a generally triangular joining member 52. (In this embodiment, the joining member 52 is, more strictly speaking, hexagonal.) The optical stand 9 is supported by the three dampers 11 and has its position in the horizontal direction decided by the joining table 52. The three dampers 11 are arranged so as not to contact the members 53 and the member 52.

Here, each damper 8 is an active damper which actively suppresses or eliminates vibration along six axes. However, a passive damper may be used, or the stage table 7 may be supported without the intervention of dampers.

In the arrangement set forth above, a wafer is transported onto the X-Y stage 3 along the conveyance path between the two struts 12 at the front of the apparatus by a conveyance device, which is not shown. When prescribed positioning is completed, the exposure apparatus exposes a plurality of exposure areas on the wafer to the pattern on the reticle to effect transfer of the pattern to the wafer while repeating scanning exposure and stepping movement. In scanning exposure, the reticle stage 1 and Y stage 3b are moved at a predetermined velocity ratio along the Y direction (scanning direction) to scan the pattern on the reticle by the slit-shaped exposing light and scan the wafer by the projected image, whereby a prescribed area on the wafer is exposed to the pattern on the reticle. When the scanning exposure of one exposure area is finished, the X stage 3a is driven along the X direction to step the wafer and position another exposure area at the scanning exposure starting position, whereupon scanning exposure is carried out. It should be noted that the disposition of each exposure area, the scanning direction (the positive or negative Y direction) and the sequence through which the exposure areas are exposed have been set in such a manner that the plurality of exposure areas on the wafer can be successively exposed in an efficient manner by the combination of the stepping movement in the X direction and movement for scanning exposure in the Y direction.

Figure 3:
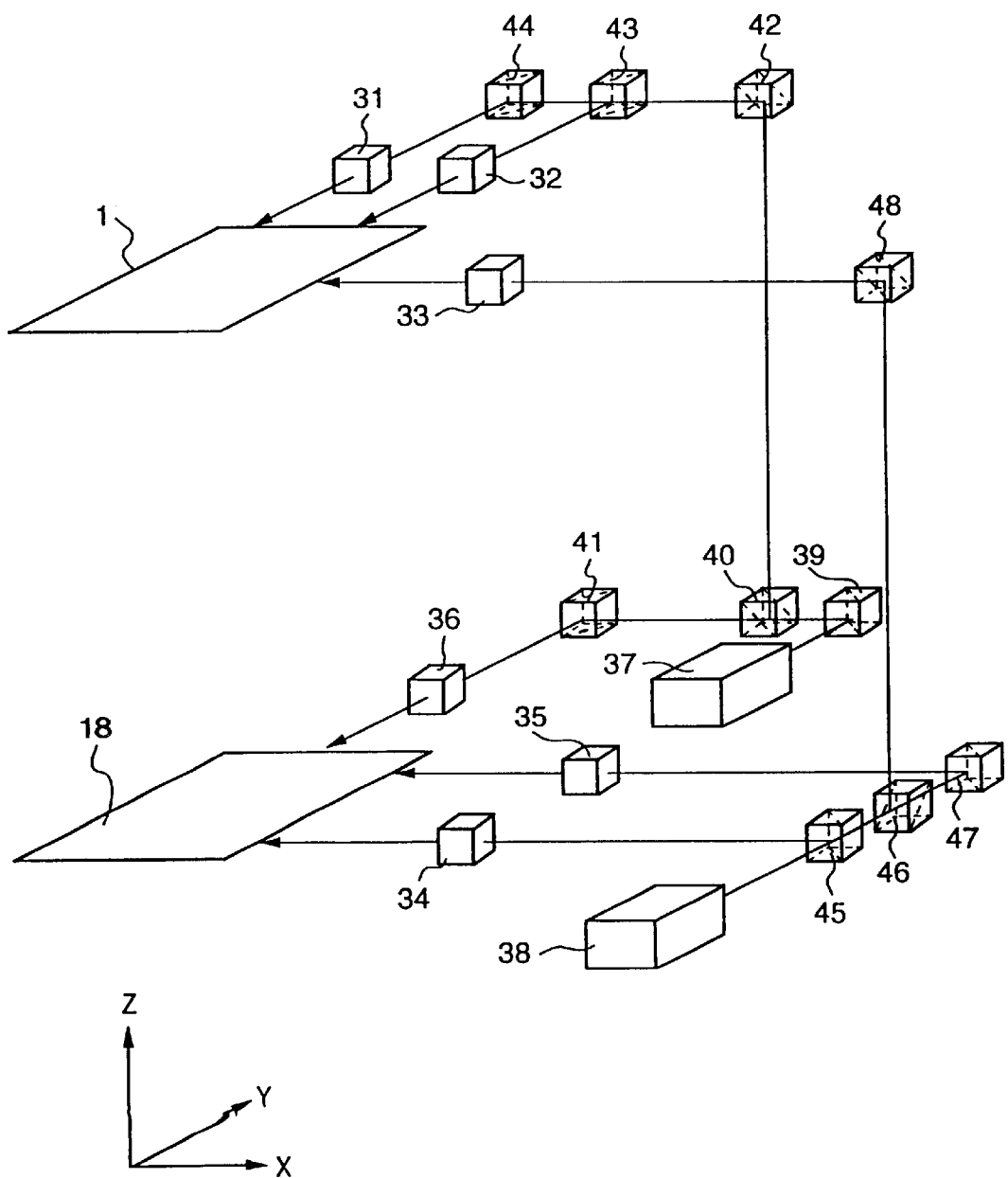
FIG. 3 is a diagram schematically illustrating an arrangement for measuring the positions of stages in order to control the driving of each stage shown in FIG. 1.

FIG. 3 is a diagram schematically illustrating an arrangement for measuring the positions of the stages in order to control the driving of the reticle stage 1, X stage 3a, Y stage 3b and the fine-adjustment stage 18.

As shown in FIG. 3, the arrangement includes laser interferometers 31, 32, 33 on the reticle side for measuring the position of the reticle stage 1 and laser interferometers 34, 35, 36 on the wafer side for measuring the position of the fine-adjustment stage 18. The laser interferometers 31, 32 on the reticle side and the laser interferometer 36 on the wafer side all use laser light from the same laser head, shown at 37. The laser interferometer 33 on the reticle side and the laser interferometers 34, 35 on the wafer side all use laser light from the same laser head, shown at 38.

The laser interferometers 31 and 32 on the reticle side are used to measure the position of the reticle stage 1 along the Y axis (scanning direction) and the θ position of the reticle stage 1 about the Z axis, respectively. The laser interferometer 33 on the reticle side is used to measure the position of the reticle stage 1 along the X axis. The laser interferometer 36 on the wafer side is used to measure the position of the fine-adjustment stage 18 along the Y axis, and the laser interferometers 34 and 35 are used to measure the position of the fine-adjustment stage 18 along the X axis and the θ position of the fine-adjustment stage 18 about the Z axis, respectively.

Though not shown, mirrors are secured to the stages 1, 80 to make possible measurement in each laser interferometer by reflecting the light from each laser interferometer, which light lies along the length measuring direction of each interferometer. The laser interferometers 31–36 are secured to the optical stand 9.

Laser light emitted in the Y direction from the laser head 37 is reflected in the X direction by a reflecting mirror 39 and is then split into light in the X and Z directions by a beam splitter 40. The laser light split off in the X direction is reflected in the Y direction by a reflecting mirror 41 and is led to the laser interferometer 36. The laser light split off in the Z direction is reflected in the X direction by a reflecting mirror 42 and split further into light in the X and Y directions by a beam splitter 43. The laser light split off in the X direction is reflected in the Y direction by a reflecting mirror 44 and is led to the laser interferometer 31. The laser light split off in the Y direction impinges upon the laser interferometer 32 as is and is used by the laser interferometer 32.

Similarly, laser light from the laser head 38 is split by beam splitters 45, 46 and reflecting mirrors 47, 48 and is used by the laser interferometers 34, 35, 33.

When scanning exposure is carried out, the value of the position of the reticle stage 1 in the Y direction measured by the laser interferometer 31 or 32 is fed back to control the driving of the linear motor 4, whereby the reticle stage 1 is moved in the Y direction. Further, the value of the position of the fine-adjustment stage 18 in the Y direction measured by the laser interferometer 36 is fed back to control the driving of the linear motor 6, whereby the Y stage 3b is moved in the Y direction. It is required that the reticle stage 1 and Y stage 3b be moved synchronously so as to establish the fixed speed ratio (e.g., 4:1) as mentioned above. Since the laser interferometer 31 or 32 and the laser interferometer 36 use the laser light from one and the same laser head 37, measurement error due to a fluctuation of the laser light is produced in identical fashion in the laser interferometers on both the reticle and wafer sides. This means that desynchronization caused by laser beam fluctuation does not occur.

Further, when scanning exposure is performed, a fixed positional relationship must be maintained between the reticle stage 1 and fine-adjustment stage 18 with in regard to the θ and X directions. A predetermined positional relationship is maintained between the reticle stage 1 and fine-adjustment stage 18 with regard to the θ direction by adjusting the position of the fine-adjustment stage 18 in the θ direction based upon the value of the position of the reticle stage 1 in the θ direction measured by the laser interferometers 31, 32 and the value of the position of the fine-adjustment stage 18 in the θ direction measured by the laser interferometers 34, 35 so as to follow up any fluctuation in the position of the reticle stage 1 in the θ direction. A predetermined positional relationship is maintained between the reticle stage 1 and fine-adjustment stage 18 with regard to the X direction by adjusting the position of the X stage 3a in the X direction based upon the value of the position of the reticle stage 1 in the X direction measured by the laser interferometer 33 and the value of the position of the fine-adjustment stage 18 in the X direction measured by the laser interferometer 34 or 35 so as to follow up any fluctuation in the position of the reticle stage 1 in the X direction. Since light from the same laser head is used in the laser interferometers on both the reticle and wafer sides in these cases, the positional relationship between both stages can be accurately maintained irrespective of any fluctuation in the laser light.

Figure 4:
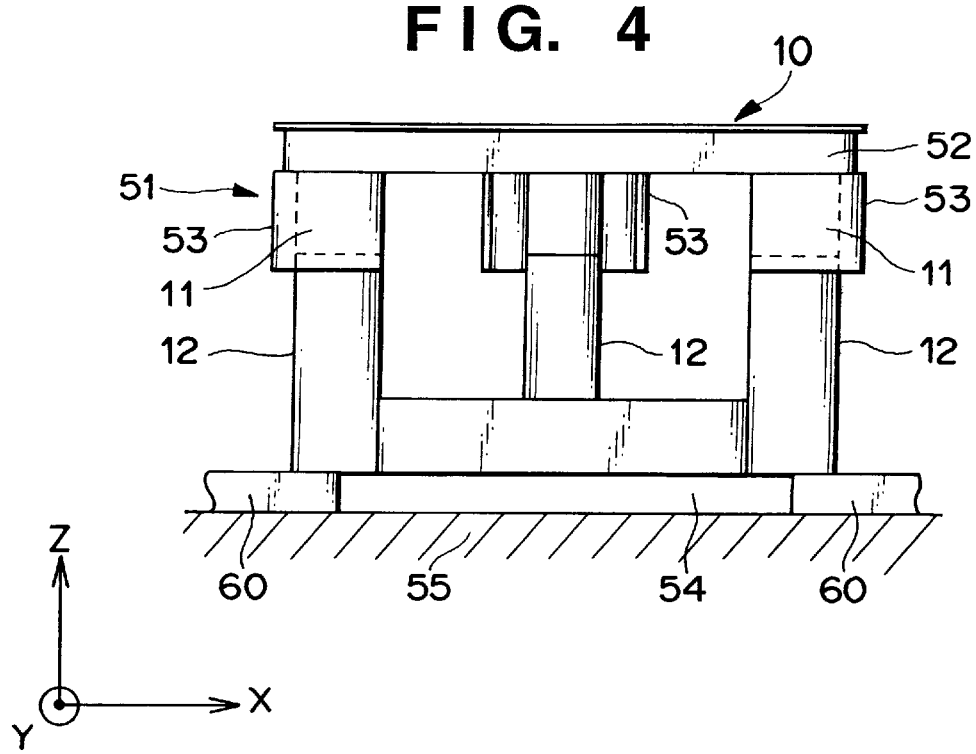
FIG. 4 is a front view showing a base frame of the exposure apparatus illustrated in FIG. 1.
Figure 5:
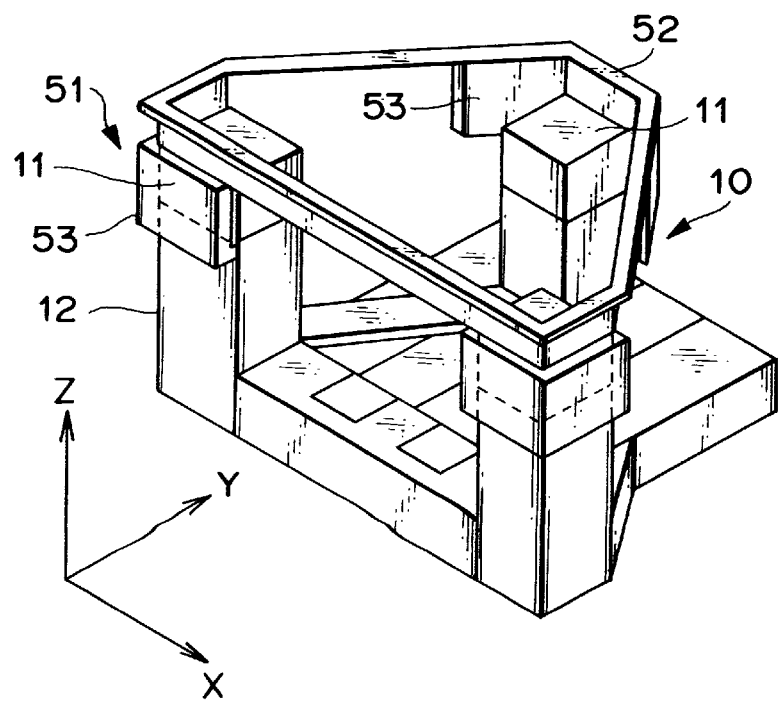
FIG. 5 is a perspective view showing a base frame of the exposure apparatus illustrated in FIG. 1.

FIGS. 4 and 5 are front and perspective views, respectively, illustrating the construction of the base frame 10. As shown in FIGS. 4 and 5, the struts 12 of the base frame 10 are joined at their upper ends by a joining member 51. The joining member 51 has a member 52 for deciding the position of the optical stand 9 in the horizontal direction and the three members 53 for joining the member 52 and the struts 12.

The member 52 is generally triangular (hexagonal, more strictly speaking, in this embodiment) when viewed from above and encircles the side face of the optical stand 9, which also is generally triangular, thereby deciding the position of the optical stand 9 in the horizontal direction. The three members 53 are for joining each of the struts 12 to the member 52. Each member 53 joins the corresponding strut 12 to the member 52 on the outer side of the triangle defined by the three struts 53. The dampers 11 are joined to neither the member 52 nor the members 53.

The base frame 10 is supported, e.g., 10 cm away from the floor 55 by a support member 60, thereby assuring a space 54 below the base frame 10. The space 54 is used for the purpose of returning air when the exposure apparatus is placed in a chamber (a housing covering the apparatus) and the interior of the chamber is air-conditioned.

Thus, joining the struts 12 by the joining member 51 increases the rigidity of the base frame 10 and makes it possible to prevent the optical stand 9 from vibrating too much when the reticle stage 1 is accelerated and decelerated. Accordingly, the time needed for attenuation of the vibration of optical stand 9 caused by acceleration of the reticle stage 1 can be shortened and scanning exposure can be performed immediately after acceleration.

Further, since the air-return space 54 is provided beneath the base frame 10, the space within the chamber can be utilized effectively, the air-conditioning effect within the chamber can be made more uniform and an excellent cleaning effect can be obtained. Achieving a more uniform air-conditioning effect makes it possible to improve the measurement accuracy of the laser interferometers.

Figure 6:
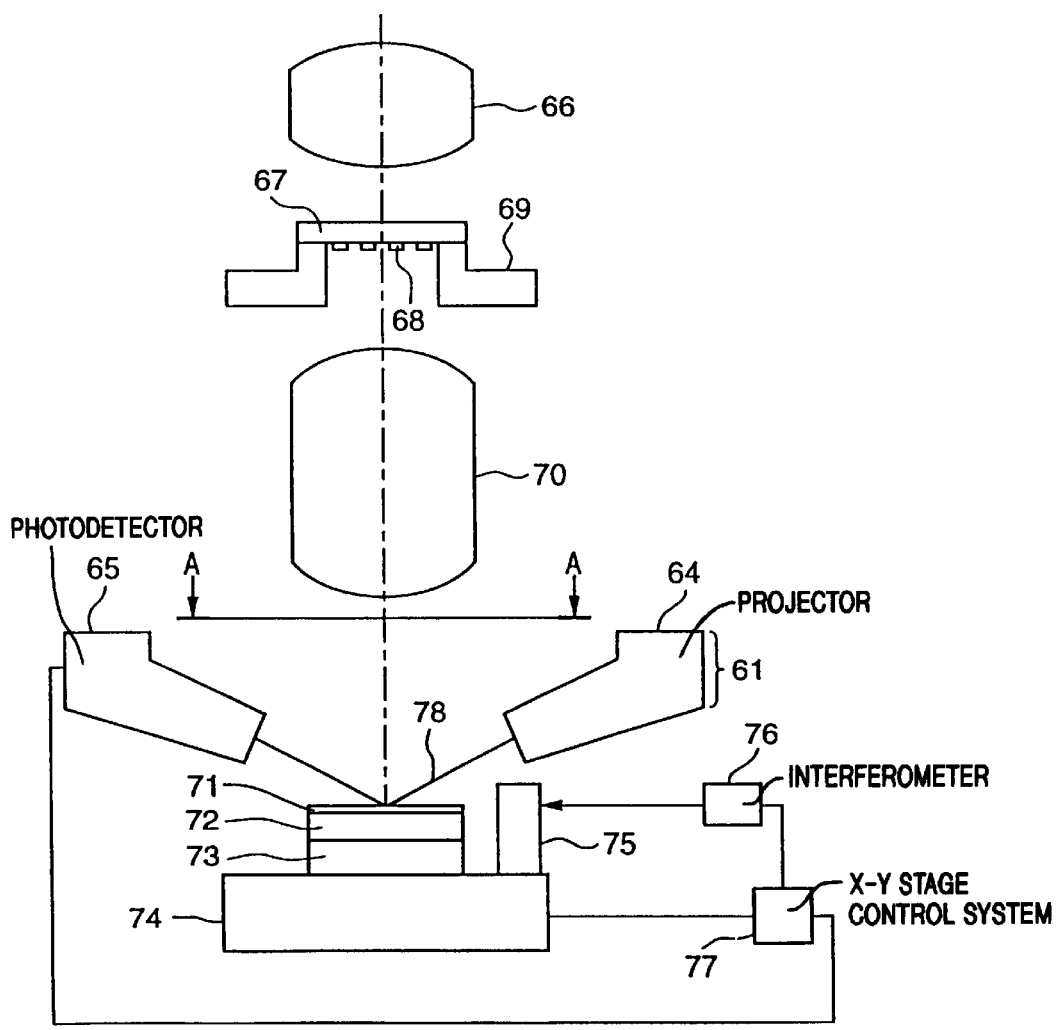
FIG. 6 is a schematic view illustrating a portion of the exposure apparatus according to a second embodiment of the present invention.

FIG. 6 is a schematic view illustrating part of a projecting exposure apparatus according to a second embodiment of the present invention. The apparatus includes an exposure illumination system 66 and a reticle (photomask) 67. The underside of the reticle 67 is provided with a circuit pattern 68 formed by vapor deposition of chrome. A reticle stage (reticle holder) 69 holds the reticle 67 and moves it in the X, Y and θ directions. More specifically, the reticle stage 69 holds the reticle 67 by suction and moves two-dimensionally in an X-Y plane of a second orthogonal coordinate system that is parallel to an X-Y plane of the first orthogonal coordinate system.

The first orthogonal coordinate system is the coordinate system which stipulates the position of an XY stage 74, which is on the wafer side, in an X-Y plane, and the second orthogonal coordinate system is the coordinate system which stipulates the position of the reticle stage 69, which is on the reticle side, in an X-Y plane. The origins of the first and second orthogonal coordinate systems coincide with the optical axis of a projecting lens 70.

The projecting lens (projecting optical system) 70 projects. the circuit pattern 68 of the reticle 67 illuminated by the exposure illumination system 66 onto a wafer 71.

The exposure illumination system 66, reticle stage 69 and projecting lens 70 are mounted on an optical stand supported via dampers on a base frame having three struts in the manner of the base frame 10 of the first embodiment. It is preferred that a joining member for joining the struts be attached to the upper ends of the struts in the manner of the joining member 51 of the first embodiment, by way of example. Further, it is preferred that an air-return space for air conditioning be provided below this base frame in the manner of the space 54 of the first embodiment, by way of example.

A wafer holder 72 holds the wafer 71 by suction. A θ-z tilt stage 73 has a θ-drive function to rotatively drive the wafer holder 72 minutely about the Z axis, a Z-drive function to drive the wafer holder 72 minutely along the Z axis and a tilt-drive function to rotatively drive the wafer holder 72 minutely about the X and Y axes. The XY stage 74 drives the θ-Z tilt stage 73 in an X-Y plane decided by the first orthogonal coordinate system.

An interferometer mirror 75 is secured to the XY stage 74 and is for monitoring the position of this stage along the X axis by an interferometer (laser interferometer) 76. The interferometer mirror 75 and the interferometer 76 are arranged in a similar fashion in the Y direction as well. The two interferometers 76 for the X and Y directions are arranged in such a manner that the laser beams emitted by them coincide on the optical axis of the projecting lens 70. The wafer 71 is positioned by an XY stage control system 77, based upon signals obtained from the interferometer mirror 75 and interferometer 76, so as to coincide with a target position at all times. More specifically, when the XY stage 74 is being moved, or when it is at rest, the position of the XY stage 74 with respect to the optical axis of the projecting lens 70 at the origin of the first orthogonal coordinate system set up in the exposure apparatus in advance is measured sequentially and the XY stage control system 66 positions the XY stage 74 at the target position based upon the results of the measurement.

A light focusing detection system 61 includes a projector 64 and a photodetector 65 for detecting the position of the surface of the wafer 71 in the direction of the optical axis (the Z direction). The projector 64 irradiates the wafer 71 obliquely with a light flux 78 of an intensity which will not sensitize a photoresist that has been applied to the wafer 71. The light flux 78 is reflected by the wafer 71 and then impinges upon the photodetector 65, as a result of which the position at which the light impinges changes in accordance with the position of the surface of the wafer 71 in the direction of the optical axis. By using the photodetector 65 to detect the position at which the light flux 78 impinges, the distance between the projecting lens 70 and the wafer 71 along the optical axis can be measured without the intermediary of the projecting lens 70.

More specifically, the light focusing detection system 61 detects the height of the surface of the wafer relative to the projecting lens 70 and the wafer 71 is driven along the Z axis by the θ-Z tilt stage 73 in such a manner that the detected value of the height will coincide with a predetermined best focus value Za (a predetermined command value indicating the height of the image plane of the projecting lens 70) serving as the target value. As a result, the projected image of the circuit pattern 68 on the reticle 67 is formed on the surface of the wafer 71. That is, the exposure apparatus of this embodiment transfers the high-contrast projected image to the wafer 71 at all times while performing focusing. It should be noted that the best focus value Za can be decided by exposing a prescribed test pattern while deviating the focusing position in advance of exposure of the circuit pattern 68, developing the test patterns and then evaluating their resolutions.

It should be noted that only a single beam of the light flux 78 of the light focusing detection system 61 is illustrated in order to simplify the description. In actuality, however, inclination (tilt) of the wafer 71 may be measured by using plural, e.g., five, beams of light flux, and the tilt of the wafer 71 may be adjusted by the θ-z tilt stage 73 in such a manner that the best focus is obtained at any image height of the projected image.

Figure 7:
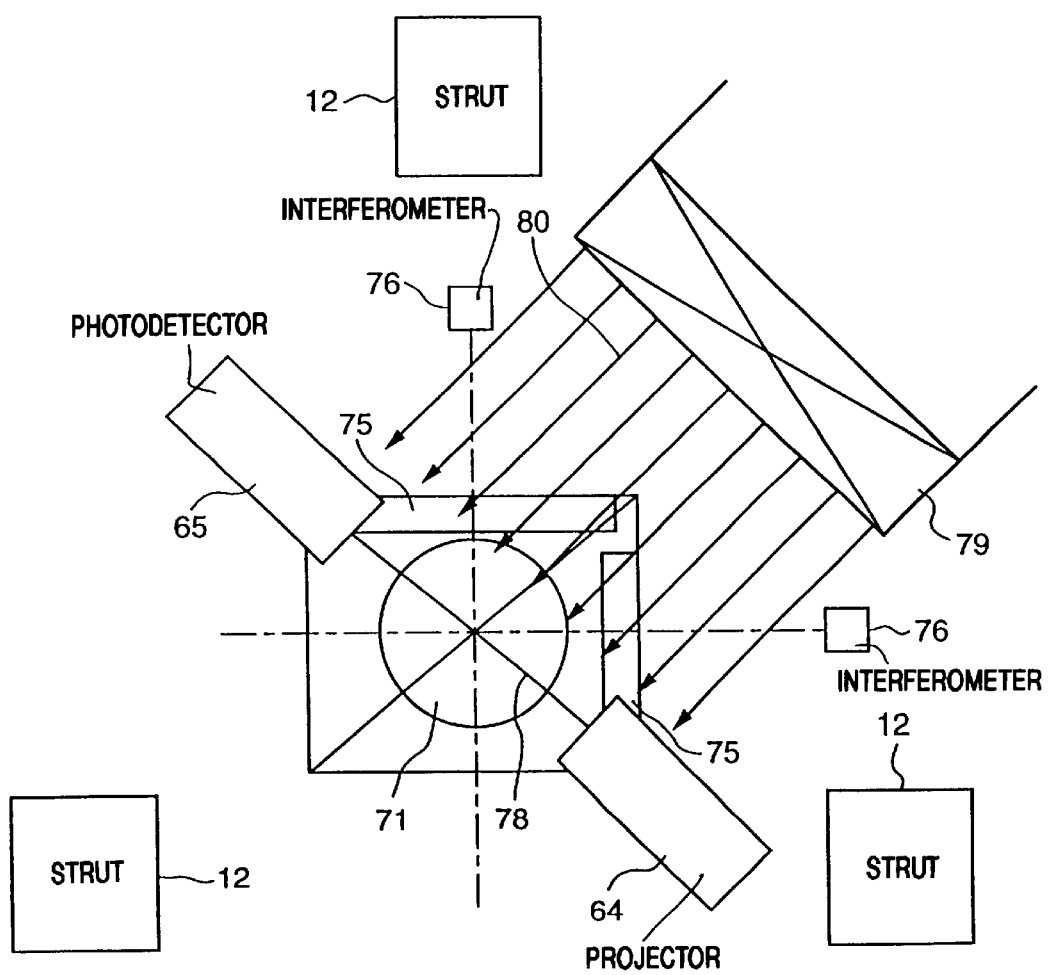
FIG. 7 is a schematic plan view of the exposure apparatus when viewed from below, along line A—A.

FIG. 7 is a plan view illustrating principal portions of the exposure apparatus when viewed from below, along line A—A. The struts of the above-mentioned base frame are shown at 12 in FIG. 7. The projector 64, light flux 78 and photodetector 65 are arrayed in a direction rotated clockwise by an angle of 45° about the X axis of the first orthogonal coordinate system, as illustrated in FIG. 7. The apparatus includes a filter 79, which expels temperature-regulated air (or another gas depending upon the embodiment). The filter 79 blows temperature-regulated air 80, which is supplied from an air-conditioning unit (not shown), toward the wafer 71 in a uniform manner. The temperature-regulated air 80 is blown across the entire face of the opening of the filter 79 and is controlled in such a manner that any irregularity in temperature will be less than ±0.05° C.

One characterizing feature of this embodiment is that the direction in which the temperature-regulated air 80 is blown is substantially at right angles to the direction of the light flux 78 in the light focusing detection system 61. As a result, the temperature-regulated air 80 flows uniformly from upstream to downstream between the projector 64 and the photodetector 65. Accordingly, almost no vortex of the kind which draws in stagnant air, namely air which has developed temperature unevenness (or a temperature change), is formed.

Figure 8:
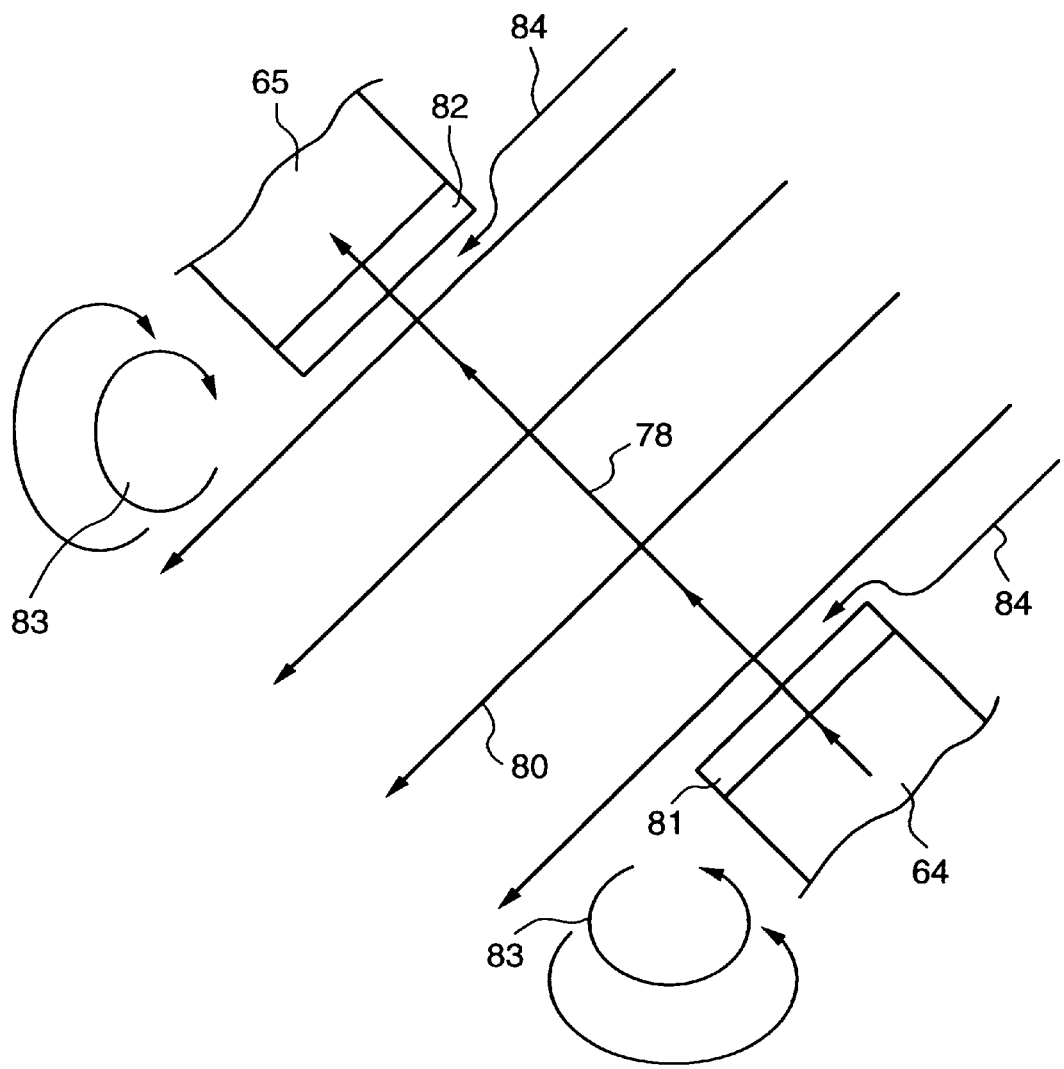
FIG. 8 is an enlarged view of a projector and a photodetector depicted in FIG. 7.

This feature will be described with reference to FIG. 8, which is an enlarged view showing the projector 64 and photodetector 65. Numeral 81 denotes the surface of an emission glass for emitting the light flux 78 from the projector 64. The surface 81 is substantially perpendicular to the light flux 78. Numeral 82 denotes the surface of a light entrance glass for allowing the light flux 78 to impinge upon the photodetector 65. The surface 82 also is substantially perpendicular to the light flux 78. Thus, the surface 81 of the emission glass and the surface 82 of the entrance glass both are substantially parallel to the direction in which the temperature-regulated air 80 is blown. As a result, the temperature-regulated air 80 not only advances through the portion intermediate the projector 64 and photodetector 65, and but also travels along the surfaces 81, 82 in close proximity thereto.

It should be noted that vortexes 83 are produced on the downstream sides of the projector 64 and photodetector 65. Though the vortexes 83 draw in downstream stagnant air in which a temperature irregularity (temperature change) has occurred, the vortexes do not extend into the regions in front of the surfaces 81, 82. Further, blowing the temperature-regulated air 80 against the projector 64 and photodetector 65 produces a flow disturbance 84 upstream of the temperature-regulated air 80 as well. However, since the temperature-regulated air does not stagnate, a change in temperature caused by the flow disturbance is very small. Accordingly, even if temperature-regulated air accompanied by the flow disturbance 84 mixes with the temperature-regulated air 80 that flows in the vicinity of the surface 81 of the emission glass and in the vicinity of the surface 82 of the entrance glass, a variation in temperature produced thereby is very small.

Thus, as described above, the temperature of the air which traverses the optical path of the light flux 78 is almost the same, across the entire region between the projector 64 and photodetector 65, as the temperature of the air blown from the filter 79. As a consequence, the amount of variation in the position of the light flux 78, which impinges upon the photodetector 65, caused by fluctuation resulting from a periodic variation in the temperature of the air depends solely upon the accuracy with which the temperature of the blown temperature-regulated air 80 is controlled; the amount of fluctuation is extremely small.

In order to raise the detection accuracy of the light focusing detection system 61, it is desired that the direction in which the temperature-regulated air 80 is blown be substantially perpendicular to the direction of the light flux 78 of the light focusing detection system 61. However, suitable effects can be obtained even in a case wherein the angle at which the two directions intersect is made 45°.

Further, in this embodiment, the direction of the light focusing detection system 61, namely, the direction in which the projector 64, light flux 78 and photodetector 65 are aligned, is rotated 45° clockwise about the X axis. It should be noted that this is only one embodiment of the present invention. If the direction of alignment is approximately perpendicular to the direction in which the temperatureregulated air 80 is blown, any direction of alignment will suffice. However, if the direction of alignment of this embodiment is adopted, temperature regulation with regard to the optical paths of measurement (the paths traversed by the laser beams) of the two laser interferometers 76 for the X and Y directions also will be performed by the temperature-regulated air 80. This results in improved measurement accuracy. This means that the filter 79 need not be provided separately for the light focusing detection system 61 and for each of the laser interferometers 76.

Thus, in accordance with the second embodiment, the focusing detection accuracy of the light focusing detection system 61 is improved.

It should be noted that components of the first embodiment can be employed with regard to portions not specifically mentioned in the second embodiment.

Figure 9:
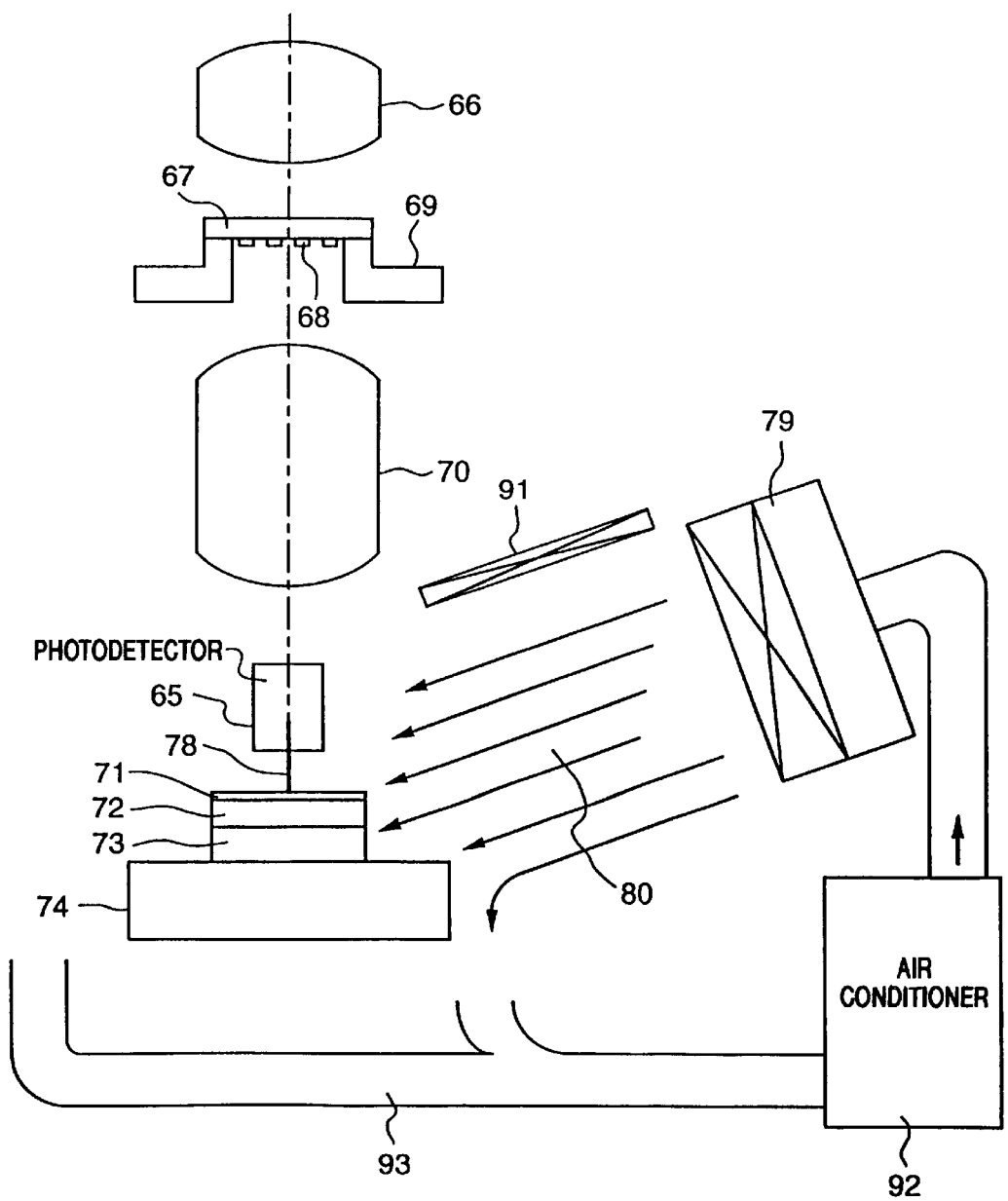
FIG. 9 is a schematic view illustrating a portion of the exposure apparatus according to a third embodiment of the present invention.

FIG. 9 is a schematic view illustrating part of a projecting exposure apparatus according to a second embodiment of the present invention. FIG. 9 corresponds to the side view of FIG. 6. The exposure apparatus according to this embodiment is obtained by additionally providing the exposure apparatus of FIG. 6 with a guide plate 91. The latter, which is provided so as to connect the upper portion of the filter 79 through which the temperature-regulated air is blown and the lower portion of the projecting lens 70, smoothes the flow of the temperature-regulated air 80 at the lower portion of the projecting lens 70. Providing the guide plate 91 raises the flow velocity of the temperature-regulated air 80 which traverses the light flux 78 of the light focusing detection system 61, as a result of which, the temperature stability furnished by the temperature-regulated air is improved. This has the effect of improving the focusing detection accuracy of the light focusing detection system 61. Shown in FIG. 9 are an air conditioner 92 connected to the filter 79, and a return duct 93. It is preferred that the return duct 93 be connected to a return space (which corresponds to the space 54 in the first embodiment) at the lower portion of the base frame supporting the optical stand.

Figure 10:
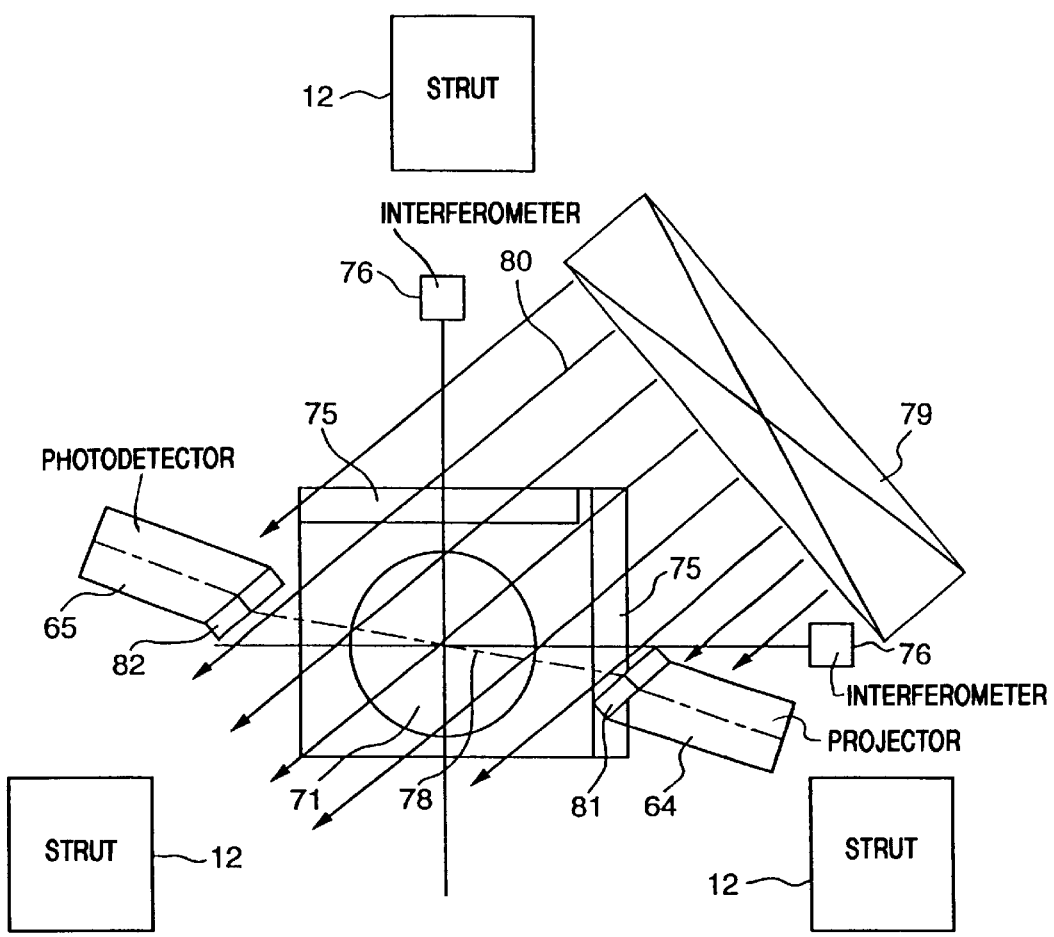
FIG. 10 is a schematic view illustrating a portion of the exposure apparatus according to a fourth embodiment of the present invention.

FIG. 10 is a schematic view illustrating principal portions of the projecting exposure apparatus according to a fourth embodiment of the present invention. The reference numerals in FIG. 10 indicate members described above. One characterizing feature of this embodiment is that the light flux 78 emitted from the projector 64 and the surface 81 of the emission glass intersect obliquely and not perpendicularly, the light flux 78 incident upon the photodetector 65 and the surface 82 of the entrance glass intersect obliquely and not perpendicularly, and the surface 81 of the emission glass and the surface 82 of the entrance glass are substantially parallel to the direction in which the temperature-regulated air 80 is blown. Consequently, regardless of the fact that the light flux 78 and the direction in which the temperature-regulated air 80 do not perpendicularly intersect, the temperature-regulated air 80 not only advances through the portion intermediate the projector 64 and photodetector 65, and but also travels along the surfaces 81, 82 in close proximity thereto.

In a case wherein the light flux 78 and the direction in which the temperature-regulated air 80 is blown intersect obliquely, it is desired that the surface 81 of the emission glass and the surface 82 of the entrance glass be made substantially parallel to the direction in which the temperature-regulated air 80 is blown, as mentioned above. As a result, temperature in the light flux 78 (along the optical path of measurement) is stabilized and made more uniform.

Figure 11:
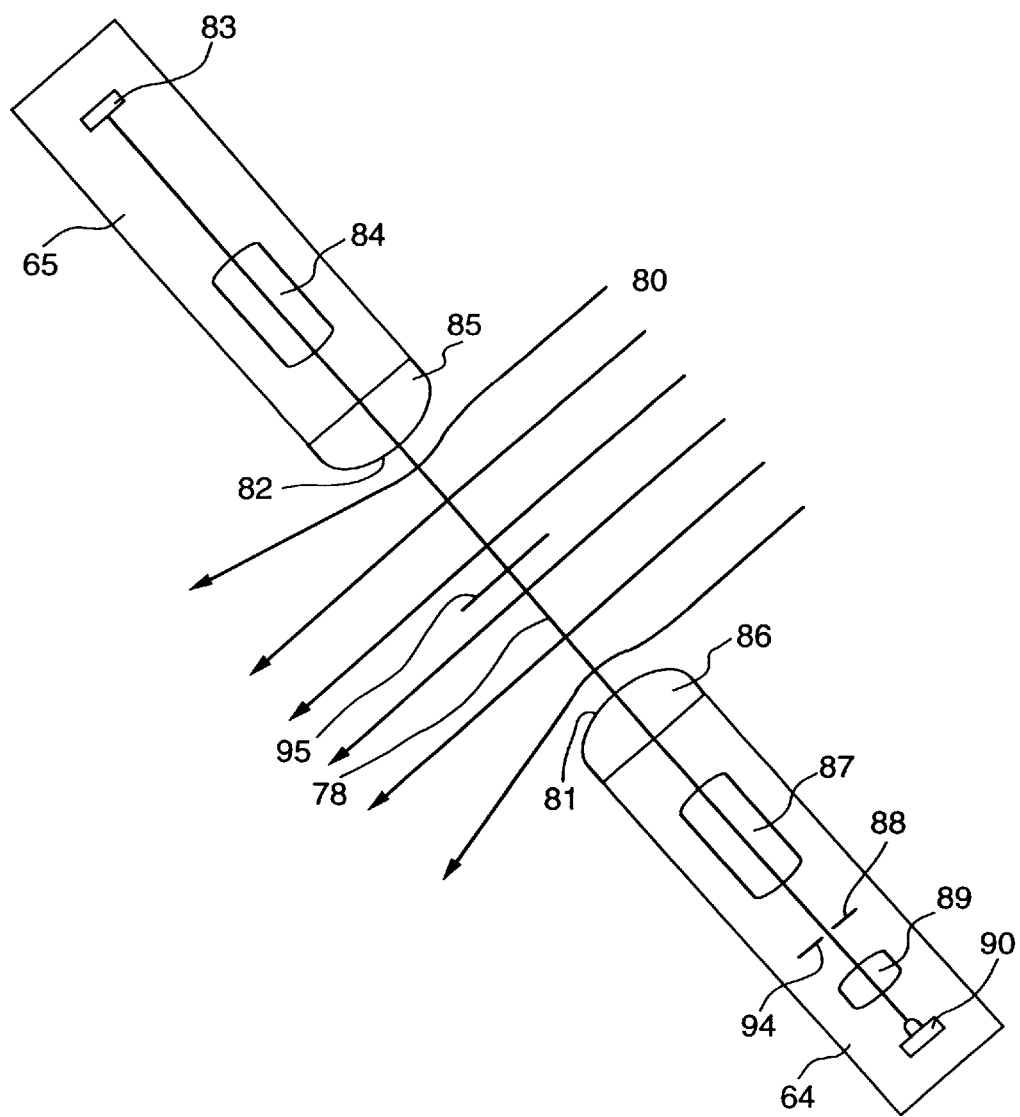
FIG. 11 is an enlarged view of a projector and a photodetector in an exposure apparatus according to a fifth embodiment.

FIG. 11 is an enlarged view showing the light focusing detection system 61, and more particularly, the projector 64 and photodetector 65, in a projecting exposure apparatus according to a fifth embodiment of the present invention. A characterizing feature of this embodiment is that the surface 81 of the emission glass of projector 64 and the surface 82 of the entrance glass of photodetector 65 are cylindrical (or spherical) rather than planar, namely that the emission glass and the entrance glass members are constituted by cylindrical lenses (or convex lenses) 86 and 85, respectively.

To realize this arrangement, the projector 64 illuminates a mask 88 by a light source 90 and mask illumination system 89, and a mark 94 provided on the mask 88 is projected as an image 95 on the wafer by a mark projecting optical system 87 and the cylindrical (or convex) lens 86. Further, the photodetector 65 is constructed in such a manner that the image 95 reflected by the wafer is formed on a photodetector element 83 by the cylindrical (or convex) lens 85 and a mark light-receiving optical system 84. If the surface 81 of the emission glass and the surface 82 of the entrance glass are thus made cylindrical (or spherical), the temperature-regulated air 80 will flow smoothly in the vicinity of the surface 81 of the emission glass and surface 82 of the entrance glass without breaking up even though the light flux 78 and the direction in which the temperature-regulated air 80 is blown intersect obliquely. That is, even in a case wherein the light flux 78 and the direction in which the temperature-regulated air 80 is blown are made to intersect obliquely, temperature in the light flux 78 (along the optical path of measurement) can be stabilized and made more uniform. Accordingly, the light focusing detection system 61 can be arranged with a greater degree of freedom.

Figure 12:
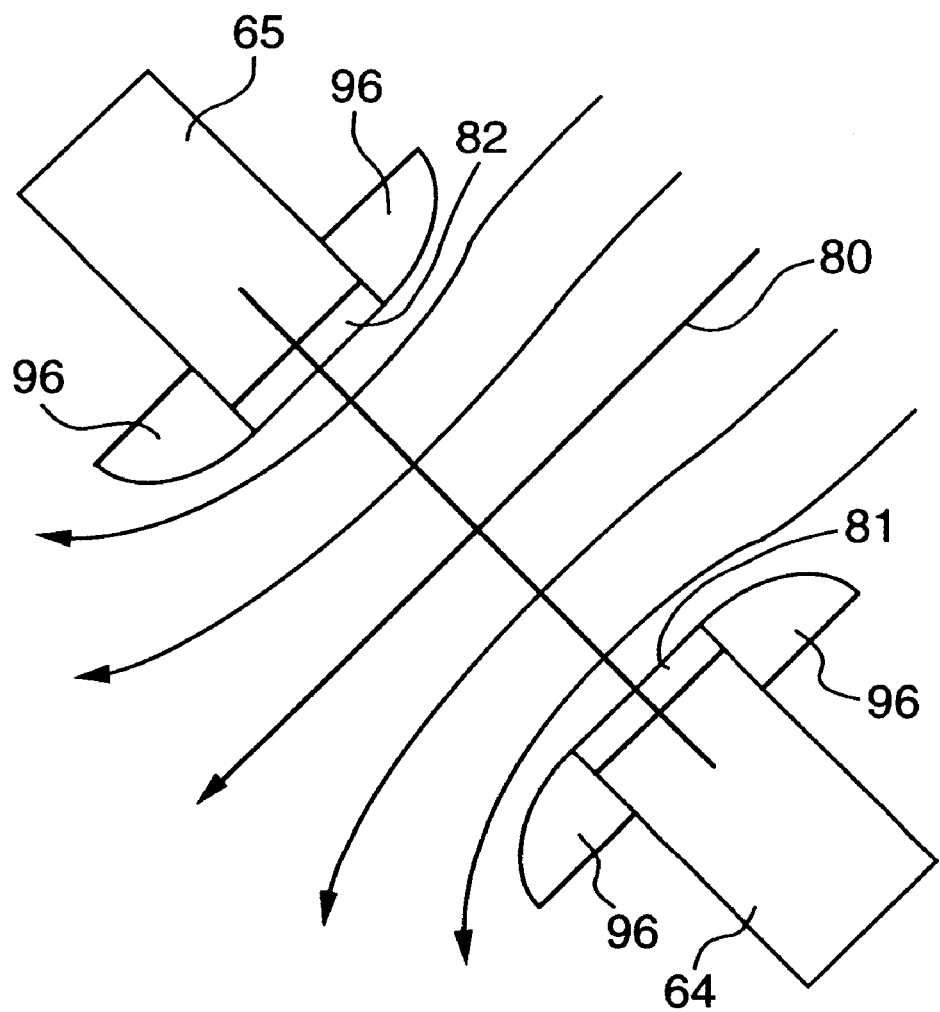
FIG. 12 is a view of a focusing position detection system in an exposure apparatus according to a sixth embodiment.

FIG. 12 is a view showing the light focusing detection system 61 in a projecting exposure apparatus according to a sixth embodiment of the present invention. The surface 81 of the emission glass and surface 82 of the entrance glass in this exposure apparatus are planar, as in the second embodiment shown in FIG. 6. However, curved-surface members 96 are provided on both sides (upstream and downstream sides in terms of the temperature-regulated air) of the emission glass and entrance glass, or surrounding the emission glass and entrance glass, whereby the projector 64 and photodetector 65 are rendered mushroom-shaped. This provides effects similar to those of the fifth embodiment. Here, the meaning of the term "mushroom-shaped" covers both a cross section which is mushroom-shaped and an external appearance which is mushroom-shaped.

Figure 13:
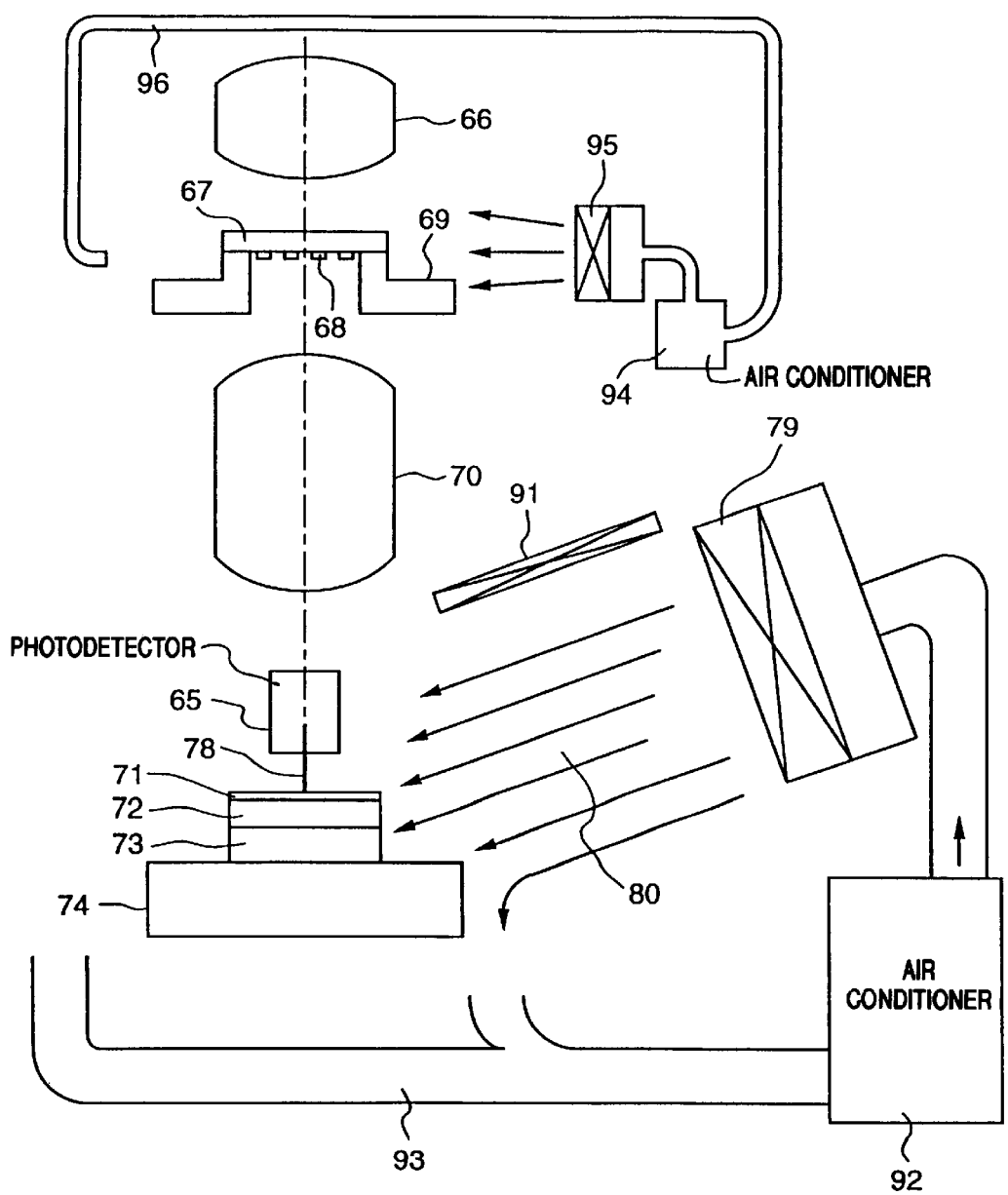
FIG. 13 is a schematic view illustrating an air-conditioning system according to a seventh embodiment of the present invention.

FIG. 13 is a schematic view illustrating the manner in which air conditioning is performed in a projecting exposure apparatus according to a seventh embodiment of the present invention. This embodiment is obtained by providing the exposure apparatus of the first embodiment with an air-conditioning system, though the air-conditioning system is applicable also to the exposure apparatus according to any of the foregoing embodiments.

As shown in FIG. 13, the optical paths of measurement of the laser interferometers 31, 32, 33 on the reticle side and the laser interferometers 34, 35, 36 on the wafer side (see FIG. 3) are air-conditioned by separate air conditioners 92, 94. A return passageway 93 of the air conditioner 92 is connected to the return space 54 below the base frame 10, as illustrated in FIG. 4, by way of example. The air conditioners 92 and 94 have blow ports 79 and 95, respectively, for the temperature-regulated air from the air conditioners. Components similar to those of the first embodiment are adopted with regard to the part of the arrangement not shown in FIG. 13.

The optical paths of measurement of the laser interferometers on the reticle side and the optical paths of measurement of the laser interferometer on the wafer side are spaced apart a considerable distance via the intermediary of the optical stand 9, as shown in FIGS. 1 and 2. As a consequence, it is difficult to air-condition each optical path of measurement uniformly by one air conditioner or blow port. With this embodiment of the invention, however, the optical paths of measurement on the reticle and wafer sides are air-conditioned separately, thereby making it possible to uniformly air-condition the optical paths of measurement on both the reticle and wafer sides.

Further, the exposure apparatus according to this embodiment of the present invention is so adapted that the reticle stage 69 and XY stage 74 continue to be moved when the apparatus is waiting for exposure to be performed. As a result, the air along the optical paths of measurement on the reticle and wafer sides is mixed so that the temperature difference relative to the surroundings is held substantially constant. In addition, the amount of heat produced by the linear motors which move the reticle stage 69 and XY stage 74 is held constant. Accordingly, the temperature along each optical path of measurement is rendered uniform and stabilized, highly accurate measurement is possible.

A procedure for manufacturing a device utilizing the exposure apparatus of the foregoing embodiments will now be described.

Figure 14:
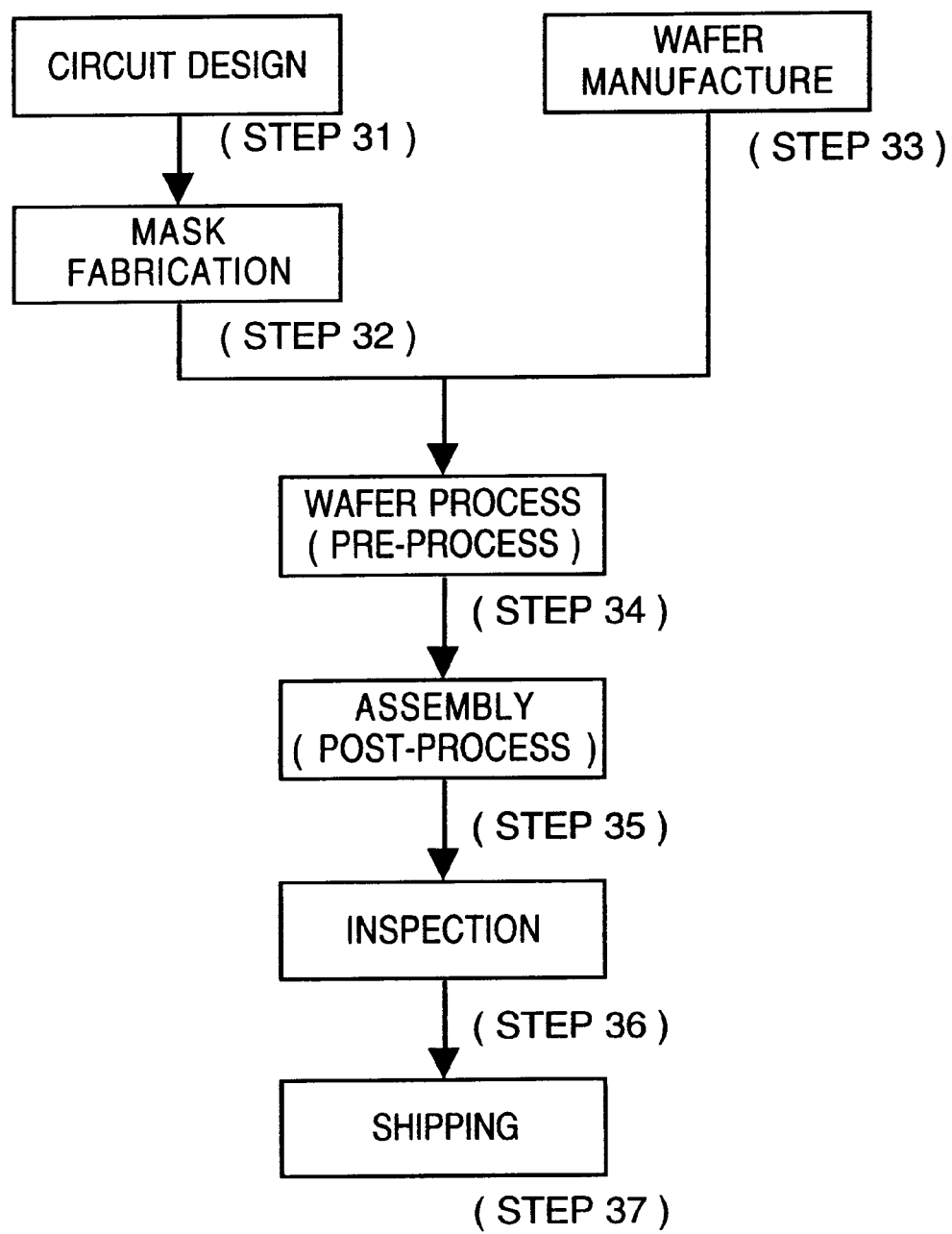
FIG. 14 is a flowchart illustrating the flow of manufacturing of a microdevice to which the exposure apparatus of the first through seventh embodiments are capable of being applied.

FIG. 14 illustrates the flow of manufacturing of a microdevice (a semiconductor chip such as an IC or LSI chip, a liquid crystal panel, a CCD, a thin-film magnetic head, a micromachine, etc.) . The circuitry of the semiconductor device is designed at step 1 (circuit design). A mask on which the designed circuit pattern has been formed is fabricated at step 32 (mask fabrication) . Meanwhile, a wafer is manufactured using a material such as silicon at step 33 (wafer manufacture). The actual circuit is formed on the wafer by lithography, using the mask and wafer that have been prepared, at step 34 (wafer process), which is also referred to as a "pre-process". A semiconductor chip is obtained, using the wafer fabricated at step 34, at step 35 (assembly), which is also referred to as a "post-process". This step includes steps such as actual assembly (dicing and bonding) and packaging (chip encapsulation). The semiconductor device fabricated at step 35 is subjected to inspections such as an operation verification test and a durability test at step 36 (inspection). The semiconductor device is completed through these steps and then is shipped (step 37).

Figure 15:
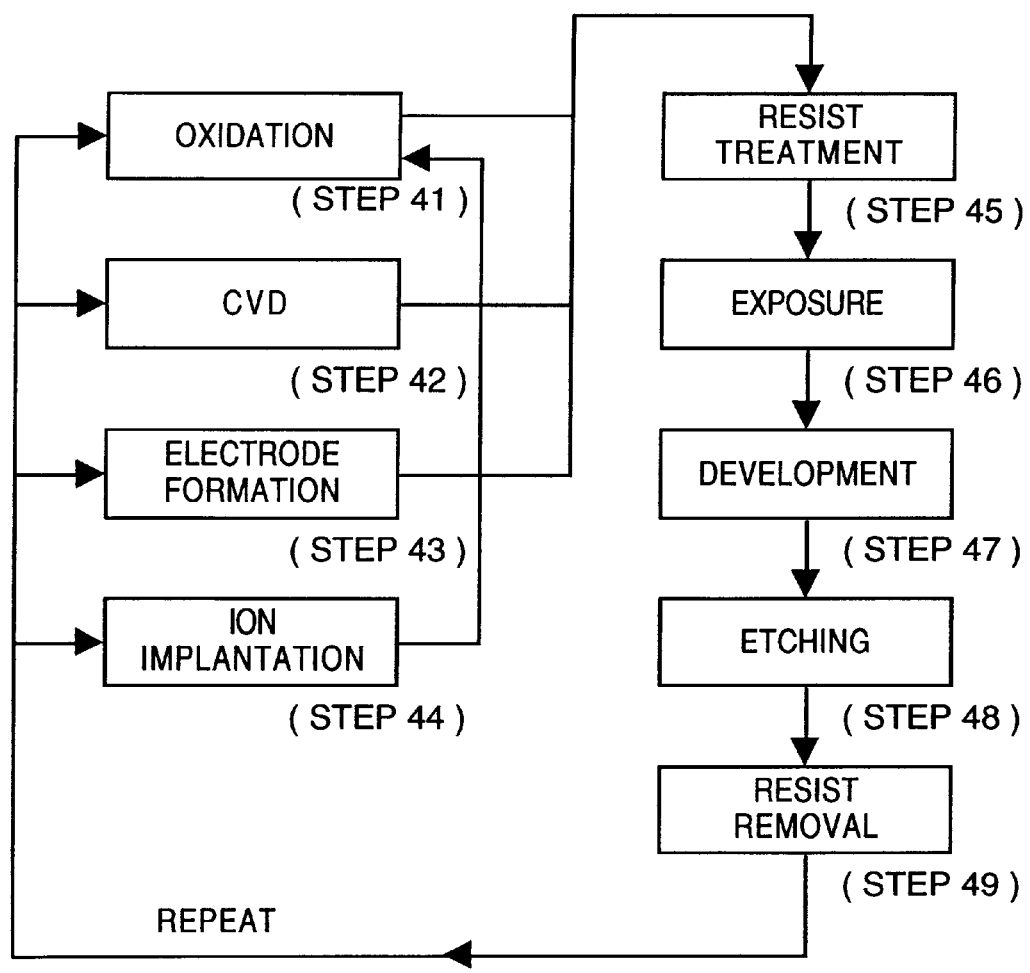
FIG. 15 is a flowchart illustrating details of the flow of the semiconductor manufacturing process shown in FIG. 14.

FIG. 15 is a flowchart illustrating the detailed flow of the wafer process mentioned above. The surface of the wafer is oxidized at step 41 (oxidation). An insulating film is formed on the wafer surface at step 42 (CVD), electrodes are formed on the wafer by vapor deposition at step 43 (electrode formation), and ions are implanted in the wafer at step 44 (ion implantation). The wafer is coated with a photoresist at step 45 (resist treatment), the wafer is exposed to the circuit pattern of the mask to print the pattern onto the wafer by the above-described exposure apparatus at step 46 (exposure), and an exposed wafer is developed at step 47 (development). Portions other than the developed photoresist are etched away at step 48 (etching), and any unnecessary resist left after etching is performed is removed at step 49 (resist removal). Multiple circuit patterns are formed on the wafer by implementing these steps repeatedly.

If the manufacturing method of this embodiment is employed, semiconductor devices having a high degree of integration can be manufactured at low cost. Manufacture of such semiconductor devices using the prior art techniques is difficult.

The advantages of the exposure apparatus according to the foregoing embodiments are as follows:

In accordance with the exposure apparatus according to the first embodiment, the optical stand on which the reticle stage and projecting optical system are mounted is supported by a plurality of base frame struts via dampers. The rigidity of the base frame can be increased by joining the struts at their upper ends using a joining member. As a result, vibration produced by acceleration and deceleration of the reticle stage can be reduced, thereby making it possible to raise the processing speed and increase throughput.

Further, by using three struts, for example, and constructing the joining member from a triangular member having a generally triangular shape and three strut joining members for joining the triangular member and each of the struts on the outer side of a triangle defined by three dampers, the rigidity of the base frame can be increased without requiring a large amount of space for installation. In this case, the optical stand can be placed on the dampers by fitting its bottom portion into the triangular member.

Further, a passageway for returning air or the like for air-conditioning purposes is provided below the base frame, for example, thereby making it possible to make uniform the air-conditioning temperature, while saving space.

Further, by providing separate air conditioners or blow ports in order to air-condition the optical paths of measurement of the laser interferometers on the reticle side and the optical paths of measurement of the laser interferometers on the wafer side, the spaced-apart optical paths of measurement can be air-conditioned uniformly and so can the overall exposure apparatus. Furthermore, a passageway for returning air or the like for air-conditioning purposes is provided below the base frame, for example, thereby making it possible to make uniform the air-conditioning temperature, while saving space.

Further, air in the vicinity of the spaces in which the stages move is mixed at all times by moving the reticle stage or wafer stage continuously even when the apparatus is waiting for exposure to be performed. As a result, the temperature difference between the spaces in which the stages move and the surroundings can be held substantially constant. In addition, the amount of heat produced in the drive mechanisms of each of the stages can be held constant at the time of exposure and when the apparatus is standing by waiting for exposure to be performed. As a result, the temperature in the vicinity of each stage can be rendered uniform, and stable and highly precise exposure can be realized.

Further, the distal ends of the projector and photodetector constructing the focusing detection system are planar surfaces, which are substantially parallel to the direction in which the temperature-regulated air flows, or curved surfaces. This smoothes the flow of the temperature-regulated air, whereby the temperature of the optical paths of measurement is rendered uniform and stable, thus raising the accuracy with which focusing position is detected.

More specifically, by making the surface of the emission glass of the projector and the surface of the entrance glass of the photo detector substantially parallel to the direction in which the temperature-regulated air flows, the air in the proximity of the surface of the emission glass and entrance glass is not allowed to stagnate. As a result, the temperature of the optical paths of measurement is rendered uniform and stable.

Further, a cylindrical lens or a convex lens is used for the emission glass member of the projector and for the entrance glass member of the photodetector, or a member for smoothing the flow of the temperature-regulated flow is attached to the distal end of the projector and the distal end of the photodetector to provide the projector and photodetector with a mushroom shape. As a result, the air in the proximity of the surface of the emission glass and entrance glass is not allowed to stagnate and the temperature of the optical paths of measurement can be rendered uniform and stable as a result.

Further, an arrangement is adopted in which the optical stand is supported by three base frame struts via dampers and the blow port of an air conditioner is placed between any two struts to make possible a more compact exposure apparatus. Furthermore, by making the direction of the flow of temperature-regulated air from the air conditioner substantially perpendicular to a line connecting two struts, the air-conditioning effect can be enhanced. Further, the space in the exposure apparatus can be utilized effectively by using a single air conditioner to air-condition the optical paths of measurement of the focusing detection system and the optical paths of measurement of the laser interferometers for detecting the stage positions in the X and/or Y direction.

Further, a guide member is provided for guiding the temperature-regulated air, which is blown from the air conditioner, to the optical path of measurement of the focusing detection system below the projecting optical system, thereby raising the flow velocity of the temperature-regulated air along the optical path of measurement and rendering the temperature along the optical path of measurement more uniform and stable.

Thus, in accordance with the present invention, a substrate can be exposed to the pattern on a reticle in a highly accurate manner. This makes it possible to manufacture devices provided with extremely fine patterns.

The present invention is not limited to the above embodiments and various changes and modifications can be made within the spirit and scope of the present invention. Therefore, to apprise the public of the scope of the present invention, the following claims are made.

What is claimed is:

1. An exposure apparatus having a reticle stage, a substrate stage and a projecting optical system which projects a pattern of a reticle onto a substrate, said apparatus comprising:

an optical stand for supporting the projecting optical system and the reticle stage;

a base frame having a plurality of struts and a joining member for joining said plurality of struts at upper portions thereof, said plurality of struts supporting said optical stand via dampers on respective ones of the struts, and said joining member being independent from said optical stand with respect to vibrations;

a chamber for covering said apparatus; and a duct located beneath said base frame for exhausting air used for conditioning temperature inside of said chamber.

2. An exposure apparatus having a reticle stage, a substrate stage and a projecting optical system which projects a pattern of a reticle onto a substrate, said apparatus comprising:

an optical stand for supporting the projecting optical system and the reticle stage; and a base frame having three struts, and a joining member for joining said three struts at upper portions thereof, said base frame supporting said optical stand via dampers on respective ones of the struts, said joining member comprising:

a frame member which encircles a side face of said optical stand; and three strut joining members for joining each of the struts and said frame member, wherein said dampers are not joined to said frame member and said strut joining members.

3. The apparatus according to claim 2, wherein said optical stand is supported on said dampers in such a manner that a bottom portion of said optical stand is fitted into said frame member.

4. An exposure apparatus having a reticle stage, a substrate stage and a projecting optical system which projects a pattern of a reticle onto a substrate, said apparatus comprising:

an optical stand for supporting the projecting optical system and the reticle stage;

a base frame, which has a plurality of struts, for supporting said optical stand via dampers on said struts;

a chamber for covering said apparatus;

temperature regulating means for supplying a temperature-controlled gas into said chamber and for controlling temperature inside of said chamber; and a duct located between said base frame and a floor for exhausting the temperature-controlled gas supplied by said temperature regulating means.

5. An exposure apparatus having a reticle stage, a substrate stage, first measuring means for measuring a position of said reticle stage using light, second measuring means for measuring a position of said substrate stage using light, and a projecting optical system for projecting a pattern of a reticle onto a substrate, the substrate being exposed to the pattern of the reticle while said substrate stage and said reticle stage are moved based upon results of measuring the positions of both stages, said apparatus comprising:

first temperature regulating means for supplying a temperature-controlled gas to an optical path of said first measuring means;

second temperature regulating means for supplying a temperature-controlled gas to an optical path of said second measuring means;

first exhausting means for exhausting the gas, which has been supplied from said first temperature regulating means; and second exhausting means for exhausting the gas, which has been supplied from said second temperature regulating means.

6. The apparatus according to claim 5, wherein said second exhausting means has a passageway, which is for exhausting the gas that has been supplied from said second temperature regulating means, below a base frame which supports said reticle stage and said projecting optical system.

7. The apparatus according to claim 5, wherein said reticle stage and said substrate stage continue to be moved even when said apparatus is standing by waiting for exposure to be performed.

8. An exposure apparatus having a reticle stage, a substrate stage, first measuring means for measuring a position of said reticle stage using light, second measuring means for measuring a position of said substrate stage using light, and a projecting optical system for projecting a pattern of a reticle onto a substrate, the substrate being exposed to the pattern of the reticle while said substrate stage and said reticle stage are moved based upon results of measuring the positions of both stages, said apparatus comprising:

temperature regulating means for supplying a temperature-controlled gas to optical paths of measurement of said first and second measuring means; and control means for causing said reticle stage and said substrate stage to continue to move while said apparatus is waiting for exposure to be performed.

9. An exposure apparatus having a projecting optical system for projecting a pattern of a reticle onto a substrate, detecting means for detecting a focusing position of said projecting optical system using light, positioning means for positioning the substrate at the focusing position of said projecting optical system based upon results of detection performed by said detecting means, and temperature regulating means for supplying a temperature-controlled gas to an optical path of measurement of said detecting means, wherein said detecting means comprises projecting means for projecting light upon the substrate, and photodetecting means for receiving reflected light from the substrate, a distal end portion of said projecting means and a distal end portion of said photodetecting means having such a shape that will not impede flow of gas supplied from said temperature regulating means.

10. The apparatus according to claim 9, wherein the distal end portion of said projecting means and the distal end portion of said photodetecting means are each constituted by a surface that is parallel to the flow of gas supplied from said temperature regulating means.

11. The apparatus according to claim 9, wherein the distal end portion of said projecting means and the distal end portion of said photodetecting means are each constituted by a smooth curved surface.

12. The apparatus according to claim 9, wherein the distal end portion of said projecting means and the distal end portion of said photodetecting means are each constituted by one of a cylindrical lens and a convex lens.

13. The apparatus according to claim 9, wherein, in order to suppress hindrance to the flow of the gas from said temperature regulating means by said projecting means and said photodetecting means, the distal end portion of said projecting means and the distal end portion of said photodetecting means each has a member, a portion of which mainly in contact with the gas flow is constituted by a curved surface, whereby said projecting means and said photodetecting means exhibit a mushroom shape.

14. The apparatus according to claim 9, wherein a direction in which the gas supplied from said temperature regulating means flows is perpendicular to an optical path of measurement between said projecting means and said photodetecting means.

15. The apparatus according to claim 9, wherein a said temperature regulating means comprises blowing means for blowing the gas, and guide means for guiding the gas, which has been blown from said blowing means, to the optical path of measurement performed by said detecting means below said projecting optical system.

16. An exposure apparatus having a reticle stage, a substrate stage, a projecting optical system, which projects a pattern of a reticle onto a substrate, detecting means for detecting a focusing position of said projecting optical system using light, and positioning means for positioning the substrate at the focusing position of said projecting optical system based upon results of detection performed by said detecting means, said apparatus comprising:

an optical stand for supporting said projecting optical system and said reticle stage;

a base frame, which has a plurality of struts, for supporting said optical stand via dampers on said struts; and temperature regulating means for supplying a temperature-regulated gas to an optical path of measurement of said detecting means, wherein said temperature regulating means comprises a gas blowing portion arranged between any two struts of said base frame so as to blow the gas toward the optical path of measurement of said detecting means.

17. A method of manufacturing a device using an exposure apparatus having a reticle stage, a substrate stage, a projecting optical system, which projects a pattern of a reticle onto a substrate, an optical stand for supporting the projecting optical system and the reticle stage, and a base frame, which has a plurality of struts, for supporting the optical stand via dampers on the struts, the base frame having a duct located between the base frame and a floor for exhausting air used for conditioning temperature inside of a chamber covering the apparatus, said method comprising the steps of:

placing a substrate on the substrate stage; and exposing a predetermined exposure area on the substrate to the pattern on the reticle using the projecting optical system while the inside of the chamber is air-conditioned.

18. A method of manufacturing a device using an exposure apparatus having a reticle stage, a substrate stage, first measuring means for measuring a position of the reticle stage using light, second measuring means for measuring a position of the substrate stage using light, a projecting optical system for projecting a pattern of a reticle onto a substrate, the substrate being exposed to the pattern of the reticle while the substrate stage and the reticle stage are moved based upon results of measuring the positions of both stages, first temperature regulating means for supplying a temperature-controlled gas to an optical path of the first measuring means, second temperature regulating means for supplying a temperature-controlled gas to an optical path of the second measuring means, first exhausting means for exhausting the gas, which has been supplied from the first temperature regulating means, and second exhausting means for exhausting the gas, which has been supplied from the second temperature regulating means, said method comprising the steps of:

placing a substrate on the substrate stage; and exposing a predetermined exposure area on the substrate to the pattern on the reticle using the projecting optical system.

19. A method of manufacturing a device using an exposure apparatus having a reticle stage, a substrate stage, first measuring means for measuring a position of the reticle stage using light, second measuring means for measuring a position of the substrate stage using light, a projecting optical system for projecting a pattern of a reticle onto a substrate, the substrate being exposed to the pattern of the reticle while the substrate stage and the reticle stage are moved based upon results of measuring the positions of both stages, and temperature regulating means for supplying a temperature-controlled gas to optical paths of measurement of the first and second measuring means, said method comprising the steps of:

placing a substrate on the substrate stage;

exposing a predetermined exposure area on the substrate to the pattern on the reticle using the projecting optical system; and causing the reticle stage and the substrate stage to continue to move while the apparatus is waiting for exposure to be performed.

20. A method of manufacturing a device using an exposure apparatus having a projecting optical system for projecting a pattern of a reticle onto a substrate, detecting means for detecting a focusing position of the projecting optical system using light, positioning means for positioning the substrate at the focusing position of the projecting optical system based upon results of detection performed by the detecting means, and temperature regulating means for supplying a temperature-controlled gas to an optical path of measurement of the detecting means, the detecting means including projecting means for projecting light upon the substrate, and photodetecting means for receiving reflected light from the substrate, a distal end portion of the projecting means and a distal end portion of the photodetecting means having such a shape that will not impede flow of gas supplied from the temperature regulating means, said method comprising the steps of:

placing a substrate on a substrate stage; and exposing a predetermined exposure area on the substrate to the pattern on the reticle using the projecting optical system.

21. A method of manufacturing a device using an exposure apparatus having a reticle stage, a substrate stage, a projecting optical system, which projects a pattern of a reticle onto a substrate, detecting means for detecting a focusing position of the projecting optical system using light, positioning means for positioning the substrate at the focusing position of the projecting optical system based upon results of detection performed by the detecting means, an optical stand on which the projecting optical system and the reticle stage are mounted, a base frame, which has a plurality of struts, for supporting the optical stand via dampers on the struts and temperature regulating means for supplying a temperature-regulated gas to an optical path of measurement of the detecting means, the temperature regulating means having a gas blowing portion arranged between any two struts of the base frame so as to blow the gas toward the optical path of measurement of the detecting means, said method comprising the steps of:

placing a substrate on the substrate stage; and exposing a predetermined exposure area on the substrate to the pattern on the reticle using the projecting optical system.

* * * * *

UNITED STATES PATENT AND TRADEMARK OFFICE
CERTIFICATE OF CORRECTION

PATENT NO. : 6,133,982
DATED : October 17, 2000
INVENTOR(S) : Mitsuru Inoue, et al.

It is certified that error appears in the above-identified patent and that said Letters Patent is hereby corrected as shown below:

Title page,
Item [56] "References Cited" "U.S. PATENT DOCUMENTS" The following should be inserted: -- 4,825,247 4/1989 Kemi, et al. .... 355/53 --.

Column 2,
Line 2, "mount ed;" should read -- mounted; --.
Line 57, "According'" should read -- ¶According --.
Line 58, "a by" should read -- by --.

Column 6,
Line 35, "1, 80" should read -- 1, 18 --.

Column 7,
Line 10, "with in" should read -- with --.

Column 8,
Line 29, "projects." should read -- projects --.

Column 10,
Line 57, "temperatureregu-" should read -- temperature- --.
Line 58, "lated" should read -- regulated --.

Column 17,
Line 39, "a said" should read -- said --.

Signed and Sealed this

Twenty-seventh day of November, 2001

*Attest:*

NICHOLAS P. GODICI
*Attesting Officer*     Acting Director *of the United States Patent and Trademark Office*

UNITED STATES PATENT AND TRADEMARK OFFICE
CERTIFICATE OF CORRECTION

PATENT NO. : 6,133,982
DATED : October 17, 2000
INVENTOR(S) : Mitsuru Inoue et al.

It is certified that error appears in the above-identified patent and that said Letters Patent is hereby corrected as shown below:

Title page,
Item [56], References Cited, U.S. PATENT DOCUMENTS,
The following should be inserted, -- 4,825,247 4/1989 Kemi, et al. ....355/53 --.

Column 2,
Line 2, "mount ed;" should read -- mounted; --.
Line 57, "According" should read -- ¶According --.
Line 58, "a by" should read -- by --.

Column 6,
Line 35, "1, 80" should read -- 1, 18 --.

Column 7,
Line 10, "with in" should read -- with --.

Column 8,
Line 29, "projects." should read -- projects --.

Column 10,
Line 57, "temperatureregu-" should read -- temperature- --.
Line 58, "lated" should read -- regulated --.

Column 17,
Line 39, "a said" should read -- said --.

Signed and Sealed this

Eleventh Day of December, 2001

Attest:

NICHOLAS P. GODICI
*Attesting Officer*  *Acting Director of the United States Patent and Trademark Office*